(12) United States Patent
Kunikiyo

(10) Patent No.: US 6,803,772 B2
(45) Date of Patent: Oct. 12, 2004

(54) INDUCTANCE MEASURING METHOD

(75) Inventor: Tatsuya Kunikiyo, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 12 days.

(21) Appl. No.: 10/396,350

(22) Filed: Mar. 26, 2003

(65) Prior Publication Data

US 2004/0080330 A1 Apr. 29, 2004

(30) Foreign Application Priority Data

Oct. 28, 2002 (JP) .................................. P2002-312476

(51) Int. Cl.$^7$ ...................... G01R 27/28; G01R 31/26
(52) U.S. Cl. ...................................... 324/654; 324/765
(58) Field of Search .............................. 324/654, 656, 324/765, 158.1

(56) References Cited

U.S. PATENT DOCUMENTS

| | | | | |
|---|---|---|---|---|
| 3,771,050 | A | * 11/1973 | Golahny et al. | ............ 324/609 |
| 5,160,893 | A | * 11/1992 | Lamson | ...................... 324/654 |
| 6,429,674 | B1 | * 8/2002 | Barth et al. | .................. 324/763 |

FOREIGN PATENT DOCUMENTS

| JP | 02-300670 | 12/1990 |
|---|---|---|
| JP | 10-339745 | 12/1998 |
| JP | P2000-28662 A | 1/2000 |

OTHER PUBLICATIONS

U.S. patent application Ser. No. 10/232,689, filed Sep. 3, 2002.
1996 IEEE pp. 69–72 An On–Chip, Attofarad Interconnect Charge–Based Capacitance Measurement (CBCM) Technique, by James C. Chen, Bruce W. McGaughy, Dennis Sylvester, and Chenming Hu, month unavailable.

* cited by examiner

Primary Examiner—David A. Zameke
Assistant Examiner—Russell M. Kobert
(74) Attorney, Agent, or Firm—McDermott Will & Emery LLP

(57) ABSTRACT

One end of an inductor is connected to a drain of a P-channel type MOS transistor. A source of source of MOS transistor is connected to an electric power source which supplies a voltage Vdd. The other end of inductor is connected via a dummy capacitor to a ground. Furthermore, a dummy resistor is connected between a drain of MOS transistor and the ground. The dummy resistor has the same resistance as that of a parasitic resistor existing between the inductor and the MOS transistor. Another dummy capacitor is connected between the dummy resistor and the ground. A current measuring device is connected between a source of MOS transistor and the ground. A current measuring device is connected between a source of MOS transistor and the ground. A current measuring device is connected between a source of MOS transistor and the ground. A current measuring device is connected between a source of MOS transistor and the ground.

7 Claims, 5 Drawing Sheets

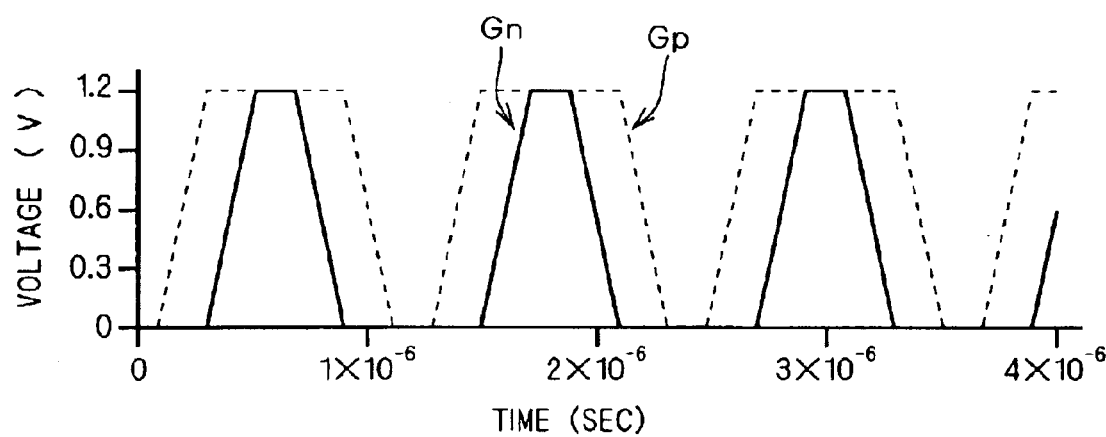
F I G . 5

INDUCTANCE MEASURING METHOD

BACKGROUND OF THE INVENTION

1. Field of the Invention

The present invention relates to a measuring apparatus and a measuring method for measuring an inductance included in a semiconductor device. More specifically, the present invention relates to a measuring apparatus and a measuring method capable of measuring a parasitic resistance and a parasitic capacitance of an inductor in addition to the inductance of this inductor.

2. Description of the Background Art

A voltage control oscillator (VCO) or a PLL (Phase Locked Loop) is generally used in the RF (Radio Frequency) analog device or in the high-speed digital device. The RF analog device uses the VCO and the PLL for generating communication carriers. Furthermore, the high-speed digital device uses the VCO and the PLL for synchronizing the data.

The VCO generates the waves based on an LC oscillation between an inductor L and a variable capacitor C. The resonance frequency is inversely proportional to $\sqrt{LC}$. Using the variable capacitor C makes it possible to set the oscillation frequency to a predetermined value.

Furthermore, to lock the oscillating condition at a predetermined frequency, the PLL is used. The PLL is a circuit for detecting a variation in an input frequency and correcting it. The PLL adjusts the oscillation frequency of VCO in accordance with a correction signal.

One of inductor elements disposed on the semiconductor devices is a spiral inductor. The spiral inductor is formed on a semiconductor substrate so that a metallic wiring is disposed in a spiral pattern when seen from above.

The Q value is generally known as an index representing an efficiency of an inductor. The Q value is defined as a ratio of an energy loss per one oscillation period with respect to an energy stored in an inductor (or a capacitor). The larger the large Q value is, the more the efficiency increases.

In the oscillator, the jitter decreases with increasing Q value when plotted on a graph with an ordinate representing the amplitude of an oscillating wave and an abscissa representing the time axis. The jitter represents a time deviation. The larger the Q value is, the smaller the time deviation of an oscillating wave becomes.

Furthermore, when the frequency spectrum of an oscillating wave is shown with respect to an abscissa representing the frequency, the half value width of a spectrum becomes small with increasing the Q value. In other words, the larger the Q value is, the faster the convergence to a predetermined frequency occurs. Therefore, the Q value is a factor determining the oscillation performance of VCO.

Hereinafter, the explanation for the above-described spiral inductor resumes. According to the above-described definition, the Q value becomes small with increasing energy loss per one oscillation period. Three factors for causing the energy loss of a spiral inductor are conductor loss, electrostatic induction loss, and electromagnetic induction loss (i.e., eddy current).

The conductor loss represents an energy loss caused by a resistance of a metallic wiring constituting the spiral inductor. The electrostatic induction loss represents an energy loss of current consumed in a semiconductor substrate when the current flows in the semiconductor substrate via a parasitic capacitance developed between the metallic wiring constituting the spiral inductor and the semiconductor substrate. The electromagnetic induction loss (i.e., eddy current) represents an energy loss of eddy current consumed in the semiconductor substrate when the eddy current appears in the semiconductor substrate due to the electromagnetic induction caused in response to a time variation of current flowing in the metallic wiring during an operation of the spiral inductor.

As described above, the mechanism of energy loss caused in the spiral inductor is complicated. Although obtaining its inductance is not easy, a variety of measuring methods have been conventionally proposed.

For example, Japanese Patent Application Laid-Open No. 2000-28662 (col. 7 to col. 9, and FIG. 1) discloses a technique for obtaining a reflection coefficient by measuring a scattering parameter (i.e., S parameter) defined on a matrix combining an incident wave and its reflected wave with respect to the spiral inductor, and then obtaining an inductance and a resistance value of the spiral inductor by plotting it on a Smith chart.

Furthermore, Japanese Patent Application Laid-Open No. 2-300670 (1990) (col. 4 to col. 6, and FIG. 1) discloses a technique for measuring a voltage by supplying a variable current to an inductor and calculating an inductance based on a measured voltage value.

The S parameter is measured in a high-frequency region exceeding 1 GHz. Hence, the measurement of S parameter tends to be adversely influenced by the noises residing in the measuring environment. For example, a pressure caused when a needle (or probe) of a measuring apparatus is brought into contact with a connecting pad of a semiconductor device, or a tiny variation of a voltage value given from the measuring apparatus to the device, gives a great influence to a measured value. Under the condition that the needle is placed on the connecting pad, the pressure applied on this needle may be different according to each measurer. This possibly causes a problem that the reflection of a signal changes and hence a measuring error will be caused. Another problem is that several hours or a comparable waiting time will be required until the measuring apparatus is stabilized.

Furthermore, performing the measurement in the high-frequency region makes a parasitic element formed due to the electrostatic induction or electromagnetic induction become a disturbing factor in increasing the measuring accuracy of inductance.

SUMMARY OF THE INVENTION

In view of the above-described problems of the prior art, the present invention has an object to propose an inductance measuring method which is simple and accurate.

To accomplish the above and other related objects, the present invention provides an inductance measuring method for measuring an inductance of an inductor disposed on a semiconductor substrate, including the following first to third steps. The first step is to supply a current pulse to the inductor by applying a periodic voltage to a control electrode of a control transistor. The control transistor has a main electrode connected to one end of the inductor. The second step is to measure a current during a rising term and a falling term of the current pulse by using a first measuring system connected to the other end of the inductor. And, the third step is to measure a current during the rising term and the falling term of the current pulse by using a second measuring system connected via a resistor to the main electrode of the control transistor. The first measuring system includes a first measuring line for measuring a current during the rising term of the current pulse, and a second measuring line for measuring a current during the falling term of the current pulse. The second measuring system includes a third measuring line for measuring a current during the rising term of the current pulse, and a fourth measuring line for measuring a current during the falling term of the current pulse. With the above features, an inductance of the inductor is measured by separating the measurement of the current flowing across the inductor into a measurement of the current during the rising term of said current pulse and a measurement of the current during the falling term of the current pulse.

Accordingly, the current pulse having a predetermined period flows via the control transistor to the inductor. The current flowing across the inductor is measured by using the first and second measuring systems. This makes it possible to separate the measurement of current into two stages; i.e., a measurement of current flowing during the rising term of the current pulse and a measurement of current flowing during the falling term of the current pulse. When the current pulse flowing across the inductor has periodicity, it is possible to prevent an accumulation or integrated value of voltage during the rising term of the current pulse, where a voltage generated between both ends of the inductance is positive, from being canceled by an accumulation or integrated value of voltage during the falling term of the current pulse, where the voltage generated between both ends of the inductance is negative. Thus, it becomes possible to accurately obtain the inductance.

These and other objects, features, aspects and advantages of the present invention will become more apparent from the following detailed description of the present invention when taken in conjunction with the accompanying drawings.

BRIEF DESCRIPTION OF THE DRAWINGS

FIG. 5 is a time diagram showing pulse signals used for measuring a parasitic capacitance of an inductor.

DESCRIPTION OF THE PREFERRED EMBODIMENTS

An inductance measuring apparatus in accordance with a preferred embodiment of the present invention is characterized in that a current pulse having a predetermined period is supplied via a transistor to an inductor and the measurement of a current flowing across the inductor is separated into two stages; i.e., a measurement during a rising term of the current pulse and a measurement during a falling term of the current pulse.

<A. Circumstances of Invention>

Figure 1:
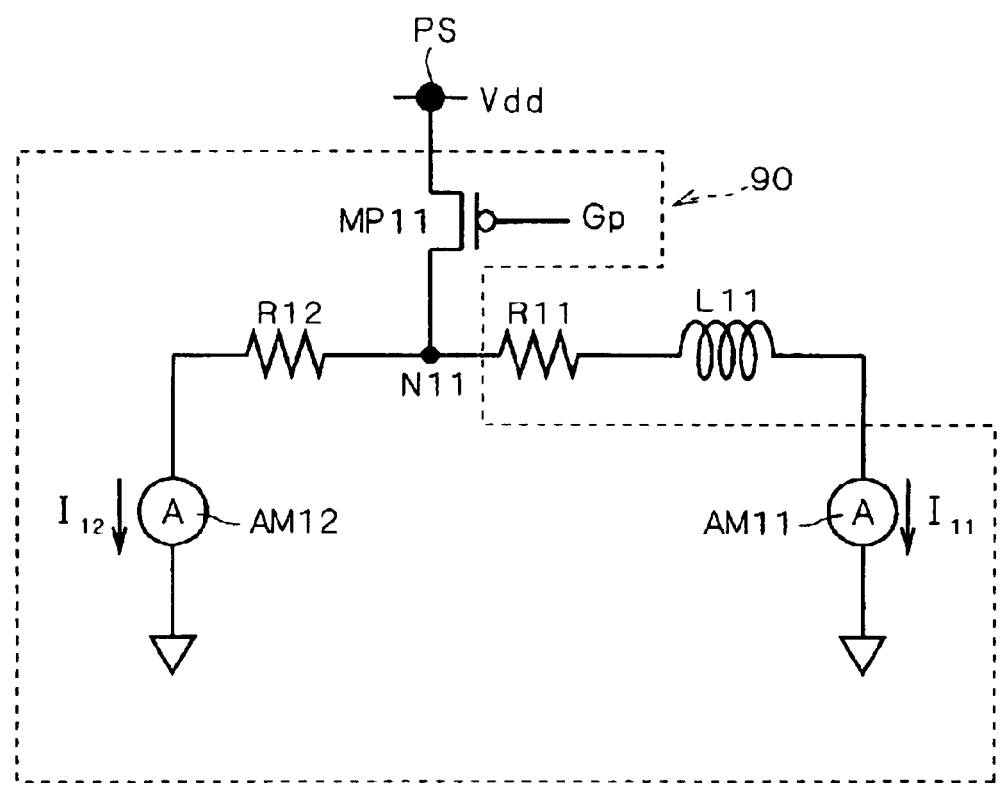
FIG. 1 is a circuit diagram explaining the circumstances in the process of developing an inductance measuring apparatus in accordance with the present invention.

The inventor of this invention has proposed an inductance measuring apparatus 90 shown in FIG. 1 according to which the inductance of an inductor is measured by supplying a current to this inductor.

As shown in FIG. 1, the inductance measuring apparatus 90 includes a P-channel type MOS transistor MP11 having a drain connected to one end of an inductor L11 serving as an object to be measured. A source of MOS transistor MP11 is connected to an electric power source PS which supplies a voltage Vdd. The other end of inductor L11 is connected via a current measuring device AM11 to a ground GND.

Furthermore, a dummy resistor $R_{12}$ is connected between the drain of MOS transistor MP11 and the ground GND. The dummy resistor $R_{12}$ has the same resistance as that of a parasitic resistor $R_{11}$ existing between the inductor L11 and the MOS transistor MP11. A current measuring device AM12 is connected between the dummy resistor $R_{12}$ and the ground GND. A connecting node between the MOS transistor MP11, the resistor $R_{12}$, and the inductor L11 is referred to as a node N11.

Figure 2:
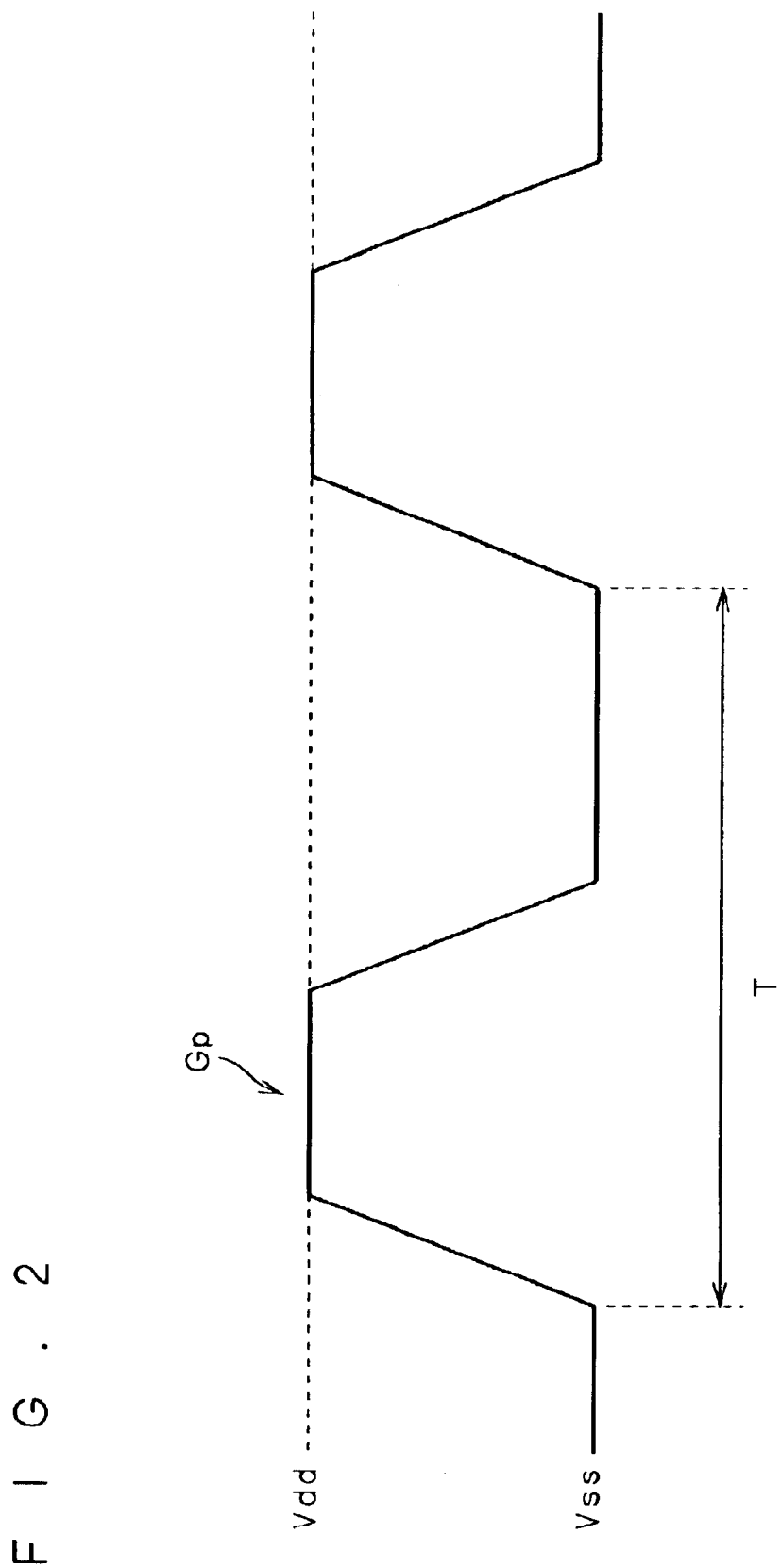
FIG. 2 is a time diagram explaining the circumstances in the process of developing the inductance measuring apparatus in accordance with the present invention.

According to the arrangement of the above-described inductance measuring apparatus 90, a pulse signal Gp having a predetermined period T is entered into the gate of MOS transistor MP11. The voltage level of pulse signal Gp is transitional and changes within the range between the voltage Vdd and a lower voltage Vss. When the pulse signal Gp is entered into the gate of MOS transistor MP11, a pulsative current flows across the inductor L11. FIG. 2 shows a waveform of pulse signal Gp. The P-channel type MOS transistor MP11 is brought into the ON state when the voltage Vss is applied to the gate of MOS transistor MP11.

The pulsative current is supplied to the inductor L11. The current measuring device AM11 measures a current $I_1$ flowing across the inductor L11. Furthermore, the current measuring device AM12 measures a current $I_2$ flowing across the dummy resistor $R_{12}$. A resistance component can be canceled by taking a difference between the measured current values. On the other hand, a voltage difference v appearing between both ends of inductor L11 is expressed by the following formula (1).

$$v = L\frac{dI}{dt} \qquad (1)$$

As apparent from this formula, the voltage v appears only when the current causes a time variation. When the current I increases with elapsing time, the voltage v is positive. When the current I decreases with elapsing time, the voltage v is negative. When the current I is constant, the voltage v is zero.

The nodal equation with respect to the node N11 is expressed by the following formula (2), when $R_{11}$ represents a resistance of parasitic resistor $R_{11}$, $I_{11}$ represents a current flowing across the parasitic resistor $R_{11}$, $R_{12}$ represents a resistance of dummy resistor $R_{12}$, and $I_{12}$ represents a current flowing across the dummy resistor $R_{12}$.

$$L\frac{dI}{dt} + R_{11}I_{11} = R_{12}I_{12} \qquad (2)$$

The above formula (2) can be modified into the following formula (3) by shifting $R_{11}I_{11}$ on the left part to the right part and integrating the both parts for a duration from time 0 to T.

$$L \int_0^T \frac{dI}{dt} dt = \int_0^T (R_{12}I_{12} - R_{11}I_{11}) dt \qquad (3)$$

If integration is performed for a term corresponding to one period of pulse signal Gp, the duration where the voltage v appearing between both ends of inductance L11 is positive (i.e., the rising term of the current pulse) is canceled by the duration where the voltage v is negative (i.e., the falling term of the current pulse). The integration result becomes zero. Hence, the inductance L cannot be obtained.

To solve this problem, the inventor has reached a technical thought that the term for the integration should be limited to either the rising time of the current pulse or the falling time of the current pulse. Meanwhile, the inventor has noticed that the inductance measuring apparatus 90 shown in FIG. 1 has no capability of measuring the current $I_{11}$ or $I_{12}$ by restricting the measurement to such a limited term.

It is also possible to replace the pulse signal Gp by a signal whose voltage level increases (or decreases) at a constant gradient with elapsing time. In this case, the inductance L can be measured by monitoring a current flowing across a transistor or a voltage applied to this transistor which represents a voltage change appearing on the inductance L in response to the applied signal. However, according to this method, it is definitely required to accomplish the measurement of current during a limited term where the voltage level of the signal increases (or decreases) at a constant gradient with elapsing time.

The use of pulse signal Gp having a predetermined period T for measuring the inductance L is based on the merit that there is no necessity of considering the measuring timing and the same inductance is stably obtained regardless of the measuring timing. For example, in a development-purpose or practical mass-production line, a side monitor mounted on a chip is used to measure the inductance L. In this case, the throughput of lots will decrease if the measuring time (timing) is limited.

It is also possible to integrate the absolute value of an integral function as shown in the following formula (4). In this case, the integrated result does not become zero even when the integration is performed for a term corresponding to one period.

$$L \int_0^T \left| \frac{dI}{dt} \right| dt = \int_0^T |R_{12}I_{12} - R_{11}I_{11}| dt \qquad (4)$$

However, the inventor has reached the conclusion that it is further difficult for the inductance measuring apparatus 90 shown in FIG. 1 to measure an integrated value of the absolute value of current difference ($I_{12}-I_{11}$). This is the reason why the inventor has developed an inductance measuring apparatus 100 which is capable of realizing the technical thought that the measurement of current should be separately performed in each of the rising and falling terms of the current pulse.

<B. Arrangement of Apparatus>

Figure 3:
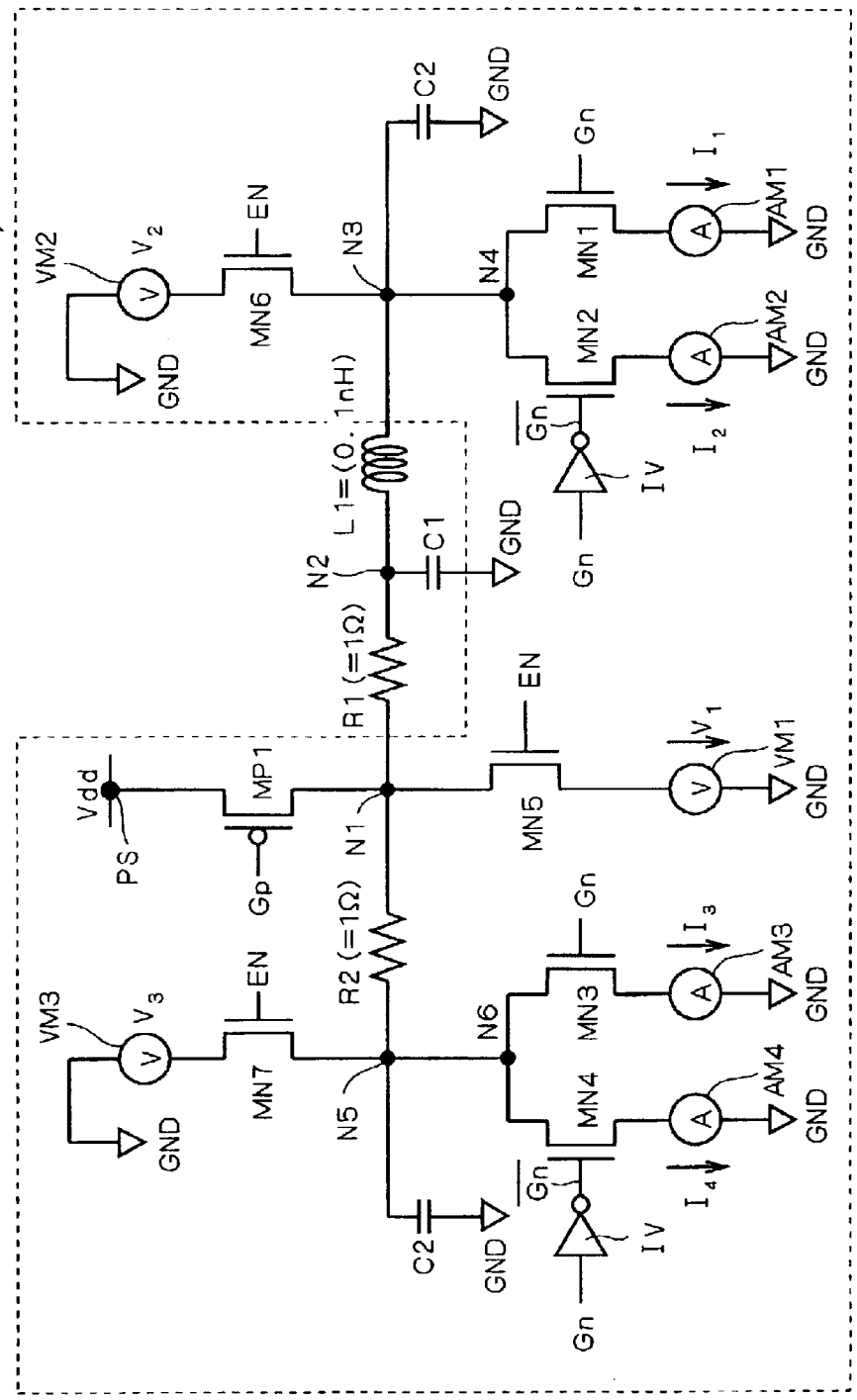
FIG. 3 is a circuit diagram showing an arrangement of the inductance measuring apparatus in accordance with the present invention.

The inductance measuring apparatus 100 will be hereinafter explained with reference to FIG. 3. As shown in FIG. 3, the inductance measuring apparatus 100 includes a P-channel type MOS transistor MP1 (i.e., control transistor) having a drain connected to one end of an inductor L1 serving as an object to be measured. A source of MOS transistor MP1 is connected to an electric power source PS which supplies a voltage Vdd. The other end of inductor L1 is connected via a dummy capacitor C2 to a ground GND.

Furthermore, a dummy resistor R2 is connected between a drain of MOS transistor MP1 and the ground GND. The dummy resistor R2 has the same resistance as that of a parasitic resistor R1 existing between the inductor L1 and the MOS transistor MP1. Another dummy capacitor C2 is connected between the dummy resistor R2 and the ground GND. The MOS transistor MP1, the resistor R2, and the inductor L1 are connected together at a common connecting node which is referred to as node N1. A parasitic capacitor C1 exists between the inductor L1 and the ground GND. The connecting node between the parasitic capacitor C1 and the inductor L1 is referred to as node N2.

Furthermore, an N-channel type MOS transistor MN5 (i.e., fifth transistor) is connected between the node N1 and the ground GND. A voltage measuring device VM1 is connected between a source of MOS transistor MN5 and the ground GND.

Furthermore, an N-channel type MOS transistor MN6 (i.e., sixth transistor) is connected between the other end of the inductor L1, which is opposed to the end connected to the node N2, and the ground GND. A voltage measuring device VM2 is connected between a source of MOS transistor MN6 and the ground GND. The MOS transistor MN6, the dummy capacitor C2, and the inductor L1 are connected together at a common connecting node which is referred to as node N3. Furthermore, N-channel type MOS transistors MN1 and MN2 (i.e., first and second transistors) are connected in parallel with each other between the node N3 and the ground GND. A current measuring device AM1 (i.e., first current measuring device) is connected between a source of MOS transistor MN1 and the ground GND. Similarly, a current measuring device AM2 (i.e., second current measuring device) is connected between a source of MOS transistor MN2 and the ground GND. The MOS transistors MN1 and MN2 have drains commonly connected to a node N4.

Furthermore, an N-channel type MOS transistor MN7 (i.e., seventh transistor) is connected between one end of the dummy resistor R2, which is opposed to the other end connected to the note N1, and the ground GND. A voltage measuring device VM3 is connected between a source of MOS transistor MN7 and the ground GND. The MOS transistor MN7, the dummy capacitor C2, and the dummy resistor R2 are connected together at a common connecting node which is referred to as node N5. Furthermore, N-channel type MOS transistors MN3 and MN4 (i.e., third and fourth transistors) are connected in parallel with each other between the node N5 and the ground GND. A current measuring device AM3 (i.e., third current measuring device) is connected between a source of MOS transistor MN3 and the ground GND. Similarly, a current measuring device AM4 (i.e., fourth current measuring device) is connected between a source of MOS transistor MN4 and the ground GND. The MOS transistors MN3 and MN4 have drains commonly connected to a node N6.

The pulse signal Gp (i.e., control signal) shown in FIG. 2 is entered into the gate of MOS transistor MP1 so that a current pulse flows across the inductor L1 and the dummy resistor R2.

A signal EN is entered into the gates of respective MOS transistors MN5, MN6, and MN7 so as to turn on these transistors MN5, MN6, and MN7 only when the measurement of resistors R1 and R2 is performed.

Furthermore, a pulse signal Gn (i.e., first pulse signal) is entered into the gates of MOS transistors MN1 and MN3 so as to turn on the transistors MN1 and MN3 for a limited duration corresponding to a rising term of the current pulse given from the MOS transistor MP1, and to turn off the transistors MN1 and MN3 for a duration other than the limited duration. Accordingly, the MOS transistors MN1 and MN3 can be regarded as pass transistors which allow the currents $I_1$ and $I_3$ to flow across the current measuring devices AM1 and AM3, respectively. The MOS transistors MN1 and MN2 and the current measuring devices AM1 and AM2 may be collectively referred to as a first measuring system.

Furthermore, a pulse signal $\overline{Gn}$ (i.e., second pulse signal), i.e., an output signal of an inverter IV which inverts the pulse signal Gn, is entered into the gates of MOS transistors MN2 and MN4 so as to turn on the transistors MN2 and MN4 for a limited duration corresponding to a falling term of the current pulse given from the MOS transistor MP1, and to turn off the transistors MN2 and MN4 for a duration other than the limited duration. Accordingly, the MOS transistors MN2 and MN4 can be regarded as pass transistors which allow the currents $I_2$ and $I_4$ to flow across the current measuring devices AM2 and AM4, respectively. The MOS transistors MN3 and MN4 and the current measuring devices AM3 and AM4 may be collectively referred to as a second measuring system.

In the following explanation, the resistance values of resistors R1 and R2 are expressed by $R_1$ and $R_2$, respectively. The inductance of inductor L1 is expressed by L. The capacitance values of capacitors C1 and C2 are expressed by $C_1$ and $C_2$, respectively. The voltage values of voltage measuring devices VM1, VM2, and VM3 are expressed by $V_1$, $V_2$, and $V_3$, respectively.

Furthermore, FIG. 3 shows the resistance values ($R_1$, $R_2$) of respective resistors R1 and R2 as being 1 Ω. The inductance (L) of inductor L1 is also shown as being 0.1 nH. However, this is a mere example and, therefore, the practical values of these circuit elements are not limited to these numerical values. The resistor R2 can be replaced by a conventionally known variable resistor. In this case, the measuring accuracy of inductance L can be improved by adjusting the resistance of resistor R2 so as to be equalized with that of resistor R1. Furthermore, FIG. 3 is a diagram showing an equivalent circuit of the inductance measuring apparatus 100. The parasitic resistor R1 includes the sum of a wiring resistance between nodes N1 and N2 and a parasitic resistance of the inductor L1. Accordingly, the inductor L1 shown in FIG. 3 is treated as having no resistance. Similarly, in the inductance measuring apparatus 90 shown in FIG. 1, the parasitic resistor R11 includes the sum of a wiring resistance and a parasitic resistance of the inductor L11.

Furthermore, the provision of capacitors C2 is for improving the measuring accuracy of current when the parasitic capacitor C1 is small. When the parasitic capacitor C1 is sufficiently large, it is possible to omit the capacitors C2. Each capacitor C2 can be replaced by a conventionally known variable capacitor. In this case, the measuring accuracy of inductance L can be improved by adjusting the capacitance of each capacitor C2.

<C. Measuring Operation>

The measuring operation of inductance measuring apparatus 100 will be explained with reference to FIG. 4.

Figure 4:
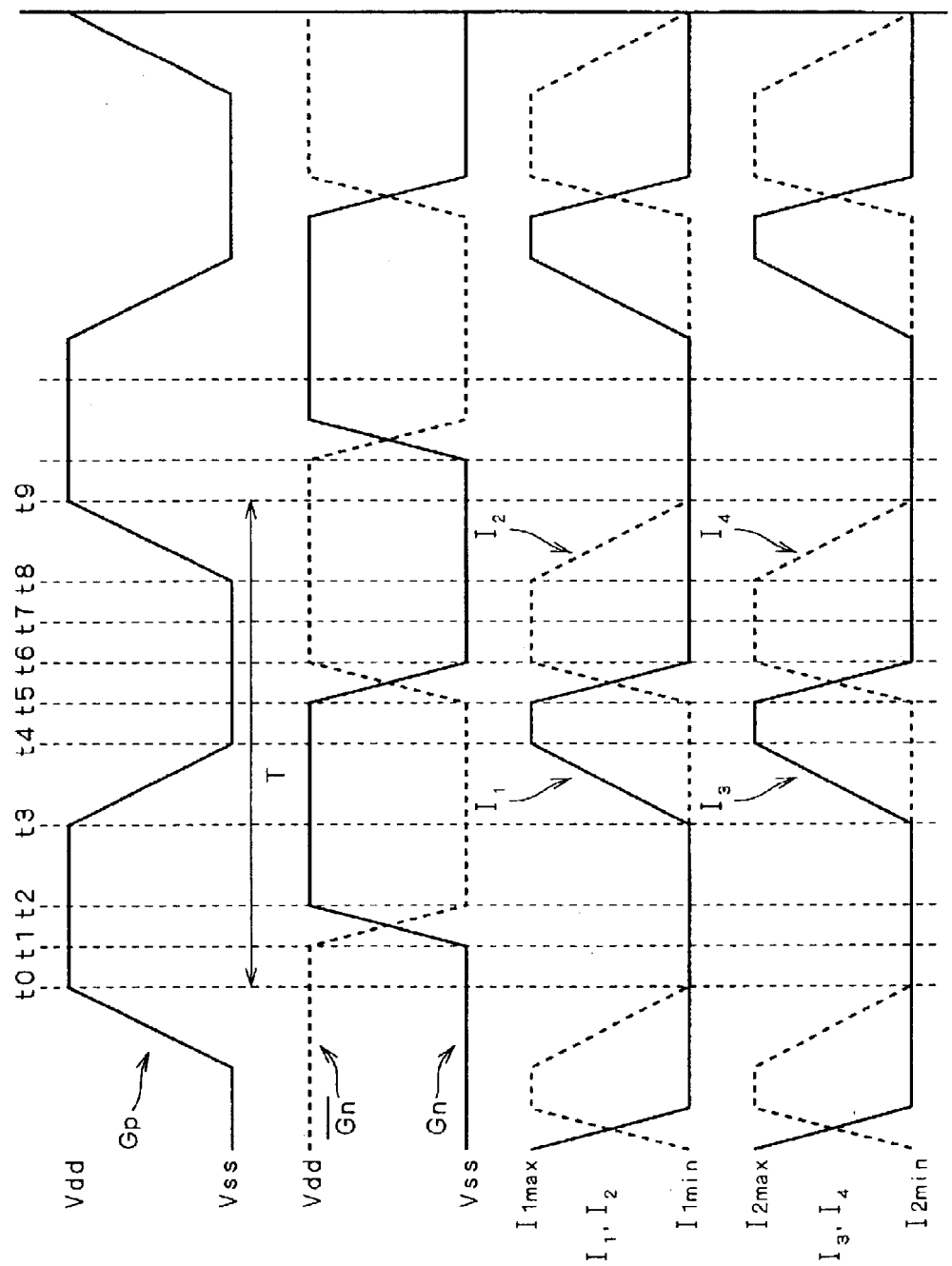
FIG. 4 is a timing chart explaining an operation of the inductance measuring apparatus in accordance with the present invention.

FIG. 4 is a timing chart showing the inductance measurement of inductor L1 performed by using the inductance measuring apparatus 100. Although not shown in FIG. 4, the voltage Vss serving as the signal EN is given to the gates of MOS transistors MN5, MN6, and MN7 during the inductance measurement to bring these transistors MN5, MN6, and MN7 into the OFF state.

FIG. 4 shows the variation characteristics of currents $I_1$, $I_2$, $I_3$ and $I_4$ in response to the pulse signals Gp and Gn. One period T of pulse signal Gp is dissected into a total of nine sections with times t0, t1, t2, t3, t4, t5, t6, t7, t8, and t9. Although the pulse signals Gp and Gn are not synchronized in timing, the length of one period is not different between them.

Hereinafter, the operation in each of the section dissected with times t0 to t9 shown in FIG. 4 will be explained with reference to FIG. 3.

<Dissected Section from Time t0 to t1>

As the voltage level of pulse signal Gp is Vdd, the MOS transistor MP1 is in the OFF state. No current flows across the inductor L1 and the dummy resistor R2.

<Dissected Section from Time t1 to t2>

This section corresponds to a rising term of pulse signal Gn where the voltage level of pulse signal Gn increases from Vss to Vdd and the condition of respective MOS transistors MN1 and MN3 changes from the OFF state to the ON state. At the same time, this section corresponds to a falling term of pulse signal $\overline{Gn}$ where the voltage level of pulse signal $\overline{Gn}$ decreases from Vdd to Vss and the condition of respective MOS transistors MN2 and MN4 changes from the ON state to the OFF state.

<Dissected Section from Time t2 to t3>

The MOS transistors MN1 and MN3 are fixed to the ON state, while the MOS transistors MN2 and MN4 are fixed to the OFF state. The MOS transistor MP1 is in the OFF state. Therefore, none of the currents $I_1$ to $I_4$ can flow.

<Dissected Section from Time t3 to t4>

This section corresponds to a falling term of pulse signal Gp where the voltage level of pulse signal Gp decreases from Vdd to Vss and the condition of MOS transistor MP1 changes from the OFF state to the ON state. The current flows across the inductor L1 and the dummy resistor R2. During this term, the MOS transistors MN1 and MN3 are fixed to the ON state. Therefore, the current flowing across the inductor L1 can be monitored by the current measuring device AM1 as a value represented by the current $I_1$ flowing across the MOS transistor MN1. The current flowing across the dummy resistor R2 can be monitored by the current measuring device AM3 as a value represented by the current $I_3$ flowing across the MOS transistor MN3. On the other hand, the MOS transistors MN2 and MN4 are in the OFF state. The current measuring devices AM2 and AM4 cannot measure the currents $I_2$ and $I_4$.

<Dissected Section from Time t4 to t5>

As the voltage level of pulse signal Gp is Vss, the MOS transistors MN1 and MN3 are completely turned on. The current measuring devices AM1 and AM3 can continuously monitor the currents $I_1$ and $I_3$.

<Dissected Section from Time t5 to t6>

This section corresponds to a falling term of pulse signal Gn where the voltage level of pulse signal Gn decreases from Vdd to Vss and the condition of respective MOS transistors MN1 and MN3 changes from the ON state to the OFF state. At the same time, this section corresponds to a rising term of pulse signal $\overline{Gn}$ where the voltage level of pulse signal $\overline{Gn}$ increases from Vss to Vdd and the condition of respective MOS transistors MN2 and MN4 changes from the OFF state to the ON state. During this term, respective MOS transistors MN1 to MN4 change their states from the ON state to the OFF state or vice versa. Therefore, there is a moment that all of the MOS transistors MN1 to MN4 are simultaneously brought into the ON state. In this case, the current flowing across the inductor L1 can be monitored by the current measuring device AM1 as a value represented by the current $I_1$ flowing across the MOS transistor MN1 and can be monitored by the current measuring device AM2 as a value represented by the current $I_2$ flowing across the MOS transistor MN2. Furthermore, the current flowing across the dummy resistor R2 can be monitored by the current measuring device AM3 as a value represented by the current $I_3$ flowing across the MOS transistor MN3 and can be monitored by the current measuring device AM4 as a value represented by the current $I_4$ flowing across the MOS transistor MN4.

From the view point of improving the measuring accuracy of inductance, it is preferable to set the time zone, in which the voltage levels of pulse signals Gn and $\overline{Gn}$ cause transitional variations, to start upon passage of a delay time after the timing t5 where the transition of pulse signal Gp from the voltage level of Vdd to Vss has accomplished, so that the current of the inductance occurring in response to a time change of voltage becomes sufficiently small.

<Dissected Sections from Time t6 to t7 and from Time t7 to t8>

The voltage level of pulse signal $\overline{Gn}$ is Vdd. Therefore, the MOS transistors MN2 and MN4 are completely turned on. The current measuring devices AM2 and AM4 can continuously monitor the currents $I_2$ and $I_4$. On the other hand, the voltage level of pulse signal $\overline{Gn}$ is Vss. The MOS transistors MN1 and MN3 are completely turned off. The current measuring devices AM1 and AM3 cannot measure the currents $I_1$ and $I_3$.

<Dissected Section from Time t8 to t9>

The voltage level of pulse signal Gp changes from Vss to Vdd. Therefore, the MOS transistor MP1 changes from the ON state to the OFF state. In this case, the currents $I_2$ and $I_4$ decrease. The current measuring devices AM2 and AM4 can continuously monitor the currents $I_2$ and $I_4$.

To surely measure the rising term and the falling term of the current pulse, it is desirable to hold the voltage levels of pulse signals Gn and $\overline{Gn}$ to a constant value equivalent to Vdd or Vss when the voltage level of pulse signal Gp causes a transitional change.

<D. Calculation of Inductance>

Hereinafter, with reference to the above-described operations, the inductance calculating method of this embodiment will be explained hereinafter.

In the section from time t3 to t6, the voltage level of pulse signal Gp decreases from Vdd to Vss and then stabilizes at Vss. The voltage $V_{N1}$ of node N1, under the condition where the currents $I_1$ and $I_3$ flow, is expressed by the following formula (5).

$$V_{N1} = R_1 I_1 + L \frac{dI_1}{dt} + R_{MN1} I_1 = R_2 I_3 + R_{MN3} I_3 \tag{5}$$

In the above formula (5), $R_{MN1}$ and $R_{MN3}$ represent the resistance values of MOS transistors MN1 and MN3, respectively.

The above formula (5) can modified into the following formula (6).

$$L \frac{dI_1}{dt} = R_2 I_3 - R_1 I_1 + R_{MN3} I_3 - R_{MN1} I_1 \tag{6}$$

Next, both of the right and left parts of the formula (6) are integrated for a term from t0 to t9, i.e., for one period T, and then divided by the period T to derive the following formula (7).

$$\frac{L}{T} \int_0^T \frac{dI_1}{dt} dt = \frac{1}{T} \int_0^T (R_2 I_3 - R_1 I_1) dt + \frac{1}{T} \int_0^T (R_{MN3} I_3 - R_{MN1} I_1) dt \tag{7}$$

The integrated value of the left part of formula (7) represents a variation of current $I_1$ during one period T. When the maximum and minimum values of current $I_1$ are expressed by $I_{1max}$ and $I_{1min}$, the integrated result is given by the following formula (8).

$$\int_0^T \frac{dI_1}{dt} dt = \int_0^T dI_1 = I_{1max} - I_{1min} \tag{8}$$

Using the above result, the formula (7) can be further modified into the following formula (9).

$$\frac{L}{T}(I_{1max} - I_{1min}) = (R_2 \overline{I_3} - R_1 \overline{I_1}) + (\overline{R_{MN3} I_3} - \overline{R_{MN1} I_1}) \tag{9}$$

In the formula (9), $I_{2max}$ and $I_{2min}$ represent the maximum and minimum values of current $I_2$, $\overline{I_1}$ and $\overline{I_3}$ represent time-average values of the currents $I_1$ and $I_3$, and $\overline{R_{MN1} I_1}$ and $\overline{R_{MN3} I_3}$ represent time-average values of the source-drain voltages of MOS transistors MN1 and MN3.

Regarding the currents $I_2$ and $I_4$ flowing during the term from time t5 to t9, the following formula (10) can be derived through the above-described processes.

$$-\frac{L}{T}(I_{2max} - I_{2min}) = (R_2 \overline{I_4} - R_1 \overline{I_2}) + (\overline{R_{MN4} I_4} - \overline{R_{MN2} I_2}) \tag{10}$$

During the term from time t3 to t4, a positive voltage appears on the inductance L1. On the other hand, during the term from time t8 to t9, a negative voltage appears on the inductance L1. This is the reason why a negative sign (−) is put on the left part of the above formula (10). In the formula (10), $\overline{I_2}$ and $\overline{I_4}$ represent time-average values of the currents $I_2$ and $I_4$, and $\overline{R_{MN4} I_4}$ and $\overline{R_{MN2} I_2}$ represent time-average values of the source-drain voltages of MOS transistors MN4 and MN2.

When the formula (9) and the formula (10) are added, both of the right and left parts become zero based on the relationships $I_{1max} = I_{2max}$ and $I_{1min} = I_{2min}$.

On the other hand, when the formula (9) is subtracted by the formula (10), the following formula (11) is obtained.

$$\frac{L}{T}[(I_{1max} - I_{1min}) + (I_{2max} - I_{2min})] = (R_2\overline{I_3} - R_1\overline{I_1}) - (R_2\overline{I_4} - R_1\overline{I_2}) + (\overline{R_{MN3}I_3} - \overline{R_{MN1}I_1}) - (\overline{R_{MN4}I_4} - \overline{R_{MN2}I_2}) \quad (11)$$

Accordingly, the inductance L is given by the following formula (12).

$$L = \frac{(R_2\overline{I_3} - R_1\overline{I_1}) - (R_2\overline{I_4} - R_1\overline{I_2}) +}{[(I_{1max} - I_{1min}) + (I_{2max} - I_{2min})]f} \quad (12)$$

In the formula (12), f is a reciprocal of T (i.e., f=1/T) and represents the frequency of pulse signals Gp and Gn.

Here, the four items, each expressing the time-average value of a product of a resistance and a current, of respective MOS transistors MN1 to MN4 can be canceled with each other. Accordingly, the inductance L can be given by the following formula (13).

$$L = \frac{(R_2\overline{I_3} - R_1\overline{I_1}) - (R_2\overline{I_4} - R_1\overline{I_2})}{[(I_{1max} - I_{1min}) + (I_{2max} - I_{2min})]f} \quad (13)$$

As understood from the formula (13), to obtain the inductance L it is necessary to obtain the resistance values $R_1$ and $R_2$, the maximum and minimum values $I_{1max}$ and $I_{1min}$ of current $I_1$, and the maximum and minimum values $I_{2max}$ and $I_{2min}$ of current $I_2$.

Hereinafter, a method for obtaining these numerical values will be explained.

First, to measure the resistance values $R_1$ and $R_2$, the voltage Vss is given to the pulse signal Gp while the voltage Vdd is given to the pulse signal Gn. The voltage Vdd is also given to the signal EN. In this case, the voltage Vss can be set to the ground level (GND).

In this case, MOS transistors MP1, MN1, MN3, MN5, MN6, and MN7 are turned on. The pulse signals Gp and Gn are generated by using a conventional pulse generating circuit such as a PLL (i.e., phase Locked Loop) or a ring oscillator. The power source voltages Vss and Vdd, given to operate this pulse generating circuit, are continuously and fixedly given during measurement. The high and low voltages of the pulse signals Gp and Gn during the measurement are fixed to the voltage levels Vss or Vdd in accordance with a predetermined term of a designated period.

The voltage applied between both ends of resistor R1 can be obtained based on the voltages $V_1$ and $V_2$ of the voltage measuring devices VM1 and VM2 which measure the voltages at the nodes N1 and N3, respectively. It is now assumed that the inductance L shown in FIG. 3 is an ideal inductor which has no resistance. Accordingly, the electric potential of the node N2 is identical with that of the node N3.

On the other hand, the current flowing across the resistor R1 is measured as current $I_1$ by the current measuring device AM1. Accordingly, the resistance value $R_1$ is obtained as $(V_1-V_2)/I_1$. The current $I_1$ measured at this moment is the maximum current $I_{1max}$.

On the other hand, the current flowing across the resistor R2 is measured as current $I_3$ by the current measuring device AM3. Similarly, the resistance value $R_2$ is obtained as $(V_1-V_3)/I_3$. The current $I_3$ measured at this moment is the maximum current $I_{3max}$.

Furthermore, as the MOS transistors MN2 and MN4 are in the OFF state, the current values measured by the current measuring devices AM2 and AM4 are substantially zero. In other words, the current $I_2$ measured at this moment is the minimum current $I_{2min}$ and the current $I_4$ measured at this moment is the minimum current $I_{4min}$. More specifically, a tiny off leak current (=approximately 0.1 pA/μm) flows across the MOS transistor when it is brought into the OFF state. This off leak current becomes the minimum currents $I_{2min}$ and $I_{4min}$.

Next, by giving the voltage Vss to the pulse signal Gp and Gn and also giving the voltage Vdd to the signal EN, the MOS transistors MP1, MN2, MN4, MN5, MN6, and MN7 are turned on. In this case, the MOS transistors MN1 and MN3 are brought into the OFF state. The current values measured by the current measuring devices AM1 and AM3 are substantially zero. In other words, the current $I_1$ measured at this moment is the minimum current $I_{1min}$ and the current $I_3$ measured at this moment is the minimum current $I_{3min}$.

Furthermore, the current flowing across the resistor R1 is measured as current $I_2$ by the current measuring device AM2. The current $I_2$ measured at this moment is the maximum current $I_{2max}$. The current flowing across the resistor R2 is measured as current $I_4$ by the current measuring device AM4. The current $I_4$ measured at this moment is the maximum current $I_{4max}$.

Through the above-described method, it becomes possible to obtain the resistance values $R_1$ and $R_2$, the maximum and minimum values $I_{1max}$ and $I_{1min}$ of current $I_1$, and the maximum and minimum values $I_{2max}$ and $I_{2min}$ of current $I_2$. Thus, the inductance L of inductor L1 can be obtained by inputting these numerical values into the formula (13).

The time-average values $\overline{I_1}$, $\overline{I_2}$, $\overline{I_3}$, and $\overline{I_4}$ are average values of $I_1$, $I_2$, $I_3$, and $I_4$ during one period T. More specifically, the currents $I_1$ and $I_3$ flow during the term from time t3 to t6 and their integrated values are measured as currents $I_1$ and $I_3$ by the current measuring devices AM1 and AM3. The measured currents $I_1$ and $I_3$ are averaged for a duration corresponding to one period T to obtain the time-average values $\overline{I_1}$ and $\overline{I_3}$. In the same manner, the time-average values $\overline{I_2}$ and $\overline{I_4}$ are obtained. It is needless to say that each of the current measuring devices AM1 to AM4 has the capability of integrating a transitional current.

<E. Method for Measuring a Parasitic Capacitance of an Inductor>

As explained previously, the spiral inductor is formed on a semiconductor substrate so that a metallic wiring is disposed in a spiral pattern when seen from above. More specifically, the spiral inductor is disposed on an insulating film of the semiconductor substrate. Accordingly, a large parasitic capacitor develops between the spiral inductor and the semiconductor substrate. This is the parasitic capacitor C1 shown FIG. 3.

The circuit simulation becomes feasible when the inductance of inductor L1, the resistance value of parasitic resistor R1, and the capacitance of parasitic capacitor C1 are obtained.

The inductance L and the parasitic resistance value $R_1$ are already obtained. Thus, a method for measuring the parasitic capacitance $C_1$ will be explained hereinafter.

The parasitic capacitance $C_1$ is measured by using the conventionally known CBCM (i.e., Charge Based Capacitance Measurement) method.

More specifically, two pulse signals Gp and Gn are given to the inductance measuring apparatus 100 to periodically turn on or off each MOS transistor. As shown in FIG. 5, each of the pulse signals Gp and Gn has the period of approximately $1.2 \times 10^{-6}$ sec. The frequency of the pulse signal Gp is identical with that of the pulse signal Gn. The phases of pulse signals Gp and Gn are different from each other. The voltages of pulse signals Gp and Gn do not change in the same time zone. In FIG. 5, an abscissa represents time (sec) and an ordinate represents voltage (V). The frequency of one period should be in the range from 10 kHz to several 10 GHz and is, therefore, not limited to the above-described value.

During a term where the MOS transistor MP1 is brought into the ON state in response to the pulse signal Gp, the parasitic capacitance $C_1$ and two dummy capacitances $C_2$ are charged. And, after the MOS transistors MN1 and MN3 turn on in response the pulse signal Gn, the current measuring devices AM1 and AM3 measure the currents $I_1$ and $I_3$, respectively.

Meanwhile, instead of using the pulse signal Gn, the voltage Vdd is always applied to input terminals of the inverters connected to the gates of MOS transistors MN2 and MN4. Thus, the MOS transistors MN2 and MN4 are always brought into the OFF state.

When f represents the frequencies of pulse signals Gp and Gn, the capacitance $C_1$ of parasitic capacitor C1 is obtained according to the formula $C_1=(I_1-I_3)/(Vdd \times f)$.

<F. Function and Effect>

According to the above-described inductance measuring apparatus 100, the current pulse having a predetermined period is supplied via the MOS transistor MP1 to the inductor L1. The current flowing across the inductor L1 is measured separately; i.e., separated into a current flowing during the rising term of the current pulse and a current flowing during the falling term of the current pulse. This makes it possible to prevent an integrated value of the voltage measured in the rising term of the current pulse is canceled with an integrated value of the voltage measured in the falling term of the current pulse, although the voltage generating between the both ends of inductance L1 during the rising term of the current pulse is positive while the voltage generating during the falling term of the current pulse is negative.

Furthermore, compared with the conventional measuring method relying on the S parameter, the measuring method of the above-described embodiment makes it possible to perform the measurement in a lower frequency region. Therefore, the measuring method of this embodiment is not adversely influenced by a resistance component derived from electrostatic or electromagnetic inductance remarkable in a higher frequency region. Thus, not only the inductance but also a parasitic resistance of the inductor can be accurately measured.

Furthermore, it is possible to measure the parasitic resistance of an inductor by using the CBCM method.

<G. Modified Embodiment>

Although the above-described embodiment is explained based on the P-channel type MOS transistor MP1 as shown in FIG. 3, it is also possible to use an N-channel type MOS transistor MP1. In this case, the pulse signal Gp is inversed beforehand so that the transistor MP1 performs the same ON and OFF operations, thereby causing the inductance measuring apparatus 100 to operate in the same manner as in the case where the P-channel type MOS transistor is used.

The merit of using an N-channel type MOS transistor MP1 is that the inductance measuring apparatus can be constituted by using only the N-channel type MOS transistors. This makes it possible to shorten the manufacturing processes.

Furthermore, the above-described inductance measuring apparatus in accordance with the above-described embodiment is not limited for the use in an ordinary silicon substrate and is, therefore, applicable to the measurement of an inductor formed on the main surface of a compound, such as GaAs, InP, GaN, GaP, SiC, and SiGe, semiconductor substrate, an SOI (i.e., Silicon On insulator) substrate, or a SiGe On Insulator substrate.

<H. Example of Application>

It is possible to install the inductance measuring apparatus of this embodiment into a semiconductor device. It is also possible to form the inductance measuring apparatus of this embodiment on a dicing line of a semiconductor wafer and on a peripheral edge of the semiconductor wafer. In this case, the inductance measurement is performed during the manufacturing process of a semiconductor device. Then, the inductance measuring apparatus is cut and removed during the dicing process of the semiconductor wafer.

This arrangement does not require a space for installing the inductance measuring apparatus in the semiconductor device. Hence, the downsizing of a semiconductor device is not restricted by the inductance measuring apparatus.

While the invention has been shown and described in detail, the foregoing description is in all aspects illustrative and not restrictive. It is therefore understood that numerous other modifications and variations can be devised without departing from the scope of the invention.

What is claimed is:

1. An inductance measuring method for measuring an inductance of an inductor disposed on a semiconductor substrate, comprising the steps of:

supplying a current pulse to said inductor by applying a periodic voltage to a control electrode of a control transistor, said control transistor having a main electrode connected to one end of said inductor;

measuring a current during rising and falling terms of said current pulse by using a first measuring system connected to the other end of said inductor; and measuring a current during rising and falling terms of said current pulse by using a second measuring system connected via a resistor to said main electrode of said control transistor, wherein
      said first measuring system comprises:
         a first measuring line for measuring a current during the rising term of said current pulse, and
         a second measuring line for measuring a current during the falling term of said current pulse,
      said second measuring system comprises:
         a third measuring line for measuring a current during the rising term of said current pulse, and
         a fourth measuring line for measuring a current during the falling term of said current pulse,
         whereby measuring an inductance of said inductor by separating the measurement of the current flowing across said inductor into a measurement of the current during the rising term of said current pulse and a measurement of the current during the falling term of said current pulse.

2. The inductance measuring method according to claim 1, wherein said first measuring line comprises a first transistor having a first main electrode connected to said other end of said inductor and a first current measuring device connected to a second main electrode of said first transistor, said second measuring line comprises a second transistor having a first main electrode connected to said other end of said inductor and a second current measuring device connected to a second main electrode of said second transistor, said third measuring line comprises a third transistor having a first main electrode connected to one end of said resistor, whose other end is connected to said main electrode of said control transistor, and a third current measuring device connected to a second main electrode of said third transistor, said fourth measuring line comprises a fourth transistor having a first main electrode connected to one end of said resistor, whose other end is connected to said main electrode of said control transistor, and a fourth current measuring device connected to a second main electrode of said fourth transistor, said control transistor for supplying said current pulse is controlled in response to a control signal including a first transition term during which a voltage level changes from a first potential to a second potential and a second transition term during which the voltage level changes from said second potential to said first potential, a first pulse signal is applied to said first and third transistors to turn on said first and third transistors for a duration including said first transition term of said control signal, and a second pulse signal is applied to said second and fourth transistors to turn on said second and fourth transistors for a duration including said second transition term of said control signal.

3. The inductance measuring method according to claim 2, wherein said second pulse signal is an inversion of said first pulse signal.

4. The inductance measuring method according to claim 3, wherein respective periods of said first and second pulse signals are identical with a period of said control signal, and said first and second pulse signals are asynchronous with said control signal.

5. The inductance measuring method according to claim 1, wherein a resistance value of said resistor is set to be equivalent to a resistance value of a parasitic resistance of said inductance.

6. The inductance measuring method according to claim 5, further comprising:

a fifth transistor having a first main electrode connected to said main electrode of said control transistor and a second main electrode connected to a first voltage measuring device;

a sixth transistor having a first main electrode connected to said other end of said inductor and a second main electrode connected to a second voltage measuring device; and a seventh transistor having a first main electrode connected to one end of said resistor, whose other end is connected to said main electrode of said control transistor, and a second main electrode connected to a third voltage measuring device, wherein said measuring method further comprising the steps of:

(a) pulse controlling said control transistor based on said control signal so as to produce said current pulse and fixing said fifth through seventh transistors to the OFF state, and pulse controlling said first through fourth transistors based on said first and second pulse signals to measure the currents flowing across said first through fourth current measuring devices;

(b) giving said control signal to said control transistor to bring said control transistor into the ON state while measuring the voltages applied to said first through third voltage measuring devices and measuring the currents flowing across said first through fourth current measuring devices under a condition where said first, third, and fifth through seventh transistors are fixed to the ON state and said second and fourth transistors are fixed to the OFF state;

(c) giving said control signal to said control transistor to bring said control transistor into the OFF state while measuring the current values flowing across said first through fourth current measuring devices under a condition where said second, fourth, and fifth through seventh transistors are fixed to the ON state and said first and third transistors are fixed to the OFF state; and (d) calculating the inductance of said inductor based on the measuring results obtained through said steps (a) through (c).

7. The inductance measuring method according to claim 6, wherein said step (a) includes a step of obtaining a time-average value ($\overline{I_1}$) of first current, a time-average value ($\overline{I_2}$) of second current, a time-average value ($\overline{I_3}$) of third current, and a time-average value ($\overline{I_4}$) of fourth current based on the first through fourth currents measured by said first through fourth current measuring devices during one period of said control signal, said step (b) includes the steps of:

obtaining the resistance value ($R_1$) of said parasitic resistor based on the voltages measured by said first and second voltage measuring devices and said first current ($I_{1max}$) measured by said first current measuring device;

obtaining the resistance value ($R_2$) of said resistor based on the voltages measured by said first and third voltage measuring devices and said third current ($I_{3max}$) measured by said third current measuring device; and obtaining the second current measured by said second current measuring device as a minimum second current ($I_{2min}$), said step (c) includes the steps of:

obtaining the first current measured by said first current measuring device as a minimum first current ($I_{1min}$), and obtaining the second current measured by said second current measuring device as a maximum second current ($I_{2max}$), and said step (d) includes a step of calculating the inductance (L) of said inductor based on the following formula:

$$L = \frac{(R_2\overline{I_3} - R_1\overline{I_1}) - (R_2\overline{I_4} - R_1\overline{I_2})}{[(I_{1max} - I_{1min}) + (I_{2max} - I_{2min})]f}.$$

* * * * *